(12) United States Patent
Ametani (10) Patent No.: US 7,383,869 B2
(45) Date of Patent: Jun. 10, 2008

(54) FILM PEELING METHOD AND FILM PEELING DEVICE

(75) Inventor: Minoru Ametani, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 263 days.

(21) Appl. No.: 11/177,031

(22) Filed: Jul. 8, 2005

(65) Prior Publication Data

US 2006/0011284 A1 Jan. 19, 2006

(30) Foreign Application Priority Data

Jul. 16, 2004 (JP) ............................. 2004-209736

(51) Int. Cl.
*B32B 37/10* (2006.01)
*B32B 38/10* (2006.01)

(52) U.S. Cl. ...................... 156/581; 156/247; 156/344; 156/584

(58) Field of Classification Search ................ 156/344, 156/584, 247, 581
See application file for complete search history.

(56) References Cited

U.S. PATENT DOCUMENTS

| | | | | |
|---|---|---|---|---|
| 5,006,190 | A * | 4/1991 | Earle | 156/247 |
| 6,471,806 | B1 * | 10/2002 | McKenna et al. | 156/160 |
| 6,500,047 | B2 * | 12/2002 | Arai et al. | 451/14 |
| 6,715,524 | B2 * | 4/2004 | Chen et al. | 156/540 |
| 6,716,295 | B2 * | 4/2004 | Yamamoto | 156/247 |
| 2001/0017189 | A1 * | 8/2001 | Tsujimoto et al. | 156/344 |
| 2006/0191633 | A1 * | 8/2006 | Hayasaka | 156/344 |

FOREIGN PATENT DOCUMENTS

| | | |
|---|---|---|
| EP | 0 318 806 A2 | 6/1989 |
| EP | 0 848 415 A1 | 6/1998 |
| EP | 0 965 664 A1 | 12/1999 |
| JP | 6-91153 | 11/1994 |
| JP | 11-204624 | 7/1999 |
| JP | 2000-77693 | 3/2000 |

(Continued)

OTHER PUBLICATIONS

Japan Office action dated Sep. 25, 2006, with English translation.

(Continued)

*Primary Examiner*—Mark A Osele
(74) *Attorney, Agent, or Firm*—Christie, Parker & Hale, LLP (57) ABSTRACT

A film peeling device for peeling a film which has been stuck onto a film sticking face of a wafer including: a wafer sucking means for sucking the wafer so that the film sticking face of the wafer can become an upper face; a peeling tape feeding means for feeding a peeling tape onto the film of the film sticking face; a pushing means for pushing only one portion of the peeling tape against the film at an edge portion of the wafer so that the adhesive strength between the peeling tape and the film can be enhanced in the one portion of the peeling tape; and a peeling means for peeling the film from the film sticking face of the wafer by the peeling tape while the one portion of the peeling tape, the adhesive strength of which has been enhanced, is used as a peeling start portion.

4 Claims, 8 Drawing Sheets

FOREIGN PATENT DOCUMENTS

| | | |
|---|---|---|
| JP | 2002-124494 | 4/2002 |
| WO | WO 02/13236 A2 | 2/2002 |

OTHER PUBLICATIONS

Austrailian Written Opinion and Search Report, dated Jun. 27, 2006 for SG200504389-8, in the name of Tokyo Seimitsu Co., Ltd.

European Search Report for application No. 05254359.2, dated Jun. 13, 2006, in the name of Tokyo Seimitsu Co., Ltd.

Patent Abstract of Japan, publication No. 01272129 A (corresponding to JP 6-91153), published on Oct. 31, 1989, in the name of Ametani, et al.

* cited by examiner

Fig. 8b

FILM PEELING METHOD AND FILM PEELING DEVICE

CROSS-REFERENCE TO RELATED APPLICATION

This application claims priority of Japanese Patent Application Number 2004-209736, filed on Jul. 16, 2004.

BACKGROUND OF THE INVENTION

1. Field of the Invention

The present invention relates to a film peeling method for peeling a film and, for example, to a film peeling method for peeling a surface-protective film which is stuck on a front surface of a wafer. The present invention also relates to a film peeling device for executing this film peeling method.

2. Description of the Related Art

In a semiconductor manufacturing process, there is a tendency that the wafer is made larger in size and thinner in thickness from the viewpoint of enhancing the packing density of the wafer. In order to make the wafer thinner, back-grinding (grinding a back surface) is conducted in which a surface-protective film is stuck on a front surface of the wafer, on which the semiconductor element has been formed, and a back surface of the wafer is ground under the condition that the front surface of this wafer is sucked onto a suction table.

When the wafer is subjected to this back-grinding process, for example, the thickness of the wafer is reduced to 50 micrometers. Therefore, the mechanical strength of the wafer, which has already been subjected to the back-grinding process, is lowered according to the reduction of the thickness. It is necessary that the above surface-protective film is peeled off from the front surface of the wafer after the completion of the back-grinding process. According to the prior art, the surface-protective film is peeled off in such a manner that a peeling tape is stuck on the surface-protective film of the wafer and then the peeling tape is wound up together with the surface-protective film so as to peel off the surface-protective film. However, this method has a problem that the wafer is damaged at the point of time when the peeling tape is stuck onto the surface-protective film because the mechanical strength of the wafer has been greatly lowered.

In order to solve the above problem, Japanese Examined Patent Publication No. 6-91153 discloses the following surface-protective film peeling method. That is, the peeling tape is made to come into pressure contact with a rear end portion of the surface-protective film of the wafer by a sticking roller and, then, the sticking roller is raised and moved forward. Next, the peeling unit is moved from the rear side to the front side so that the surface-protective film can be peeled off from the wafer together with the peeling tape. In this case, the adhesive strength between the peeling tape and the surface-protective film is enhanced at the position where the peeling tape and the surface-protective film are made to come into pressure contact with each other. Therefore, when the peeling unit is moved, it is possible to continuously peel off the surface-protective film in such a manner that the position where the peeling tape and the surface-protective film are made to come into pressure contact with each other is made to be a start point of peeling.

However, as the sticking roller used for the film peeling device described in the Japanese Examined Patent Publication No. 6-91153 is relatively long, in the case where the rear end portion of the wafer is made to come into pressure contact by the sticking roller, a load is given by the sticking roller to a portion of the wafer where peeling tape does not exist. As described before, the thickness of the wafer supplied to the film peeling device is made smaller by back-grinding. Accordingly, there is a possibility that the wafer is damaged at a position where peeling tape does not exist.

In order to easily peel the surface-protective film, it is actually unnecessary to conduct the pressure-contact-operation by the sticking roller even in the portion where peeling tape does not exist. In this case, the entire film peeling device may be made larger in size.

Further, as the sticking roller is moved with the peeling tape, in the case where the film peeling device is used over a long period of time, the sticking roller is polluted with the adhesive of the peeling tape. Accordingly, there is a possibility that the adhesive is transferred onto the suction table. Especially in the case where the thickness of the wafer is reduced by the back-grinding, a distance between the upper face of the wafer and the upper face of the table is small. Therefore, the transfer of the adhesive described above tends to occur. As a porous ceramic plate has been recently used as the suction table in many cases, holes on the sucking plate are clogged by the transfer of the adhesive described above so that the wafer can not be appropriately sucked onto the suction table. In this case, as the adhesive strength of the surface-protective film with respect to the wafer is higher than the sucking force of the table, and the wafer is removed from the suction table together with the peeling tape when moving the peeling unit, this may damage the wafer.

The present invention has been accomplished in view of the above circumstances. It is an object of the present invention to provide a film peeling method capable of peeling a film from a wafer without damaging the wafer and without making the entire device larger in size. It is also an object of the present invention to provide a film peeling device for executing this film peeling method.

SUMMARY OF THE INVENTION

In order to accomplish the above objects, the first aspect of the present invention provides a film peeling device for peeling a film which has been stuck onto a film sticking face of a wafer, comprising: a wafer sucking means for sucking the wafer so that the film sticking face of the wafer can become an upper face; a peeling tape feeding means for feeding a peeling tape onto the film of the film sticking face; a pushing means for pushing only one portion of the peeling tape against the film of the wafer at an edge portion of the wafer so that the adhesive strength between the peeling tape and the film can be enhanced in the one portion of the peeling tape; and a peeling means for peeling the film from the film sticking face of the wafer by the peeling tape while the one portion of the peeling tape, the adhesive strength of which has been enhanced, is being used as a peeling start portion.

According to the first aspect, in order to form a portion, the adhesive strength of which is high, only one portion of the peeling tape at the edge portion of the wafer is pushed by the pushing means. Therefore, the load applied to the wafer by the pushing means is relatively low. Accordingly, it is possible to prevent the wafer from being damaged. Further, it is sufficient that the pushing member may be a relatively small member. Therefore, it is possible to avoid a case in which the entire film peeling device is made large in size. Further, as only the necessary portion of the peeling tape is pushed by the pushing means, one portion of the wafer sucking means, which is located around the wafer, is not pushed. Therefore, even when the pushing means is polluted with adhesive from the peeling tape, the wafer sucking means is not polluted with the adhesive. Accordingly, it is possible to avoid the occurrence of the problem that the wafer sucking means is clogged and that the wafer is damaged on the basis of incomplete sucking.

The second aspect of the present invention provides a film peeling device, according to the first aspect in which the pushing means includes a pushing roller moving in a substantially traverse direction of the peeling tape, wherein the one portion of the peeling tape is pushed when the pushing roller moves on the one portion of the peeling tape.

According to the second aspect, as the pushing roller is used, when the pushing roller is rolled, only a desired portion of the peeling tape can be easily pushed. When the pushing roller is reciprocated several times at a desired position, the adhesive strength between the peeling tape and the film can be further enhanced.

The third aspect of the present invention provides a film peeling device according to the second aspect, the pushing means includes a rotatable disk, wherein the pushing roller is attached to a lower face of the rotatable disk in such a manner that the rotary axis of the pushing roller can be located on the radius of the rotatable disk, and the pushing roller is moved along an arc on the peeling tape when the rotatable disk is rotated.

According to the third aspect, by simply rotating the rotatable disk, a desired portion of the peeling tape can be very easily pushed. Due to the foregoing, the adhesive strength between the peeling tape and the film can be positively enhanced.

The fourth aspect of the present invention provides a film peeling device according to the third aspect, wherein an auxiliary roller is attached to the lower face of the rotatable disk, and the auxiliary roller pushes the film of the wafer located at a position where the peeling tape does not exist.

In the case where a single pushing roller, which is provided on the lower face of the rotatable disk, is used, the pushing roller applies a load like a cantilever, and there is a possibility that the pushing roller is damaged. However, according to the fourth aspect, the load is dispersed by the auxiliary rollers. Accordingly, there is no possibility that only the pushing roller applies the load. Consequently, the adhesive strength between the peeling tape and the film can be enhanced in a very stable way.

The fifth aspect of the present invention provides a film peeling device according to the fourth aspect, wherein positions at which the pushing roller and the auxiliary roller are located can be adjusted in the radial direction on the lower face of the rotatable disk.

In the fifth aspect, even when a film is peeled off from a wafer of a different size, the present invention can be applied to this wafer by adjusting the position of the pushing roller and/or the auxiliary roller.

The sixth aspect provides a film sticking device according to one of the first to the fifth aspect, wherein the wafer sucking means can be elevated, and a peeling tape, which has been fed by the peeling tape feeding means, can be contacted with only the film of the film sticking face when the wafer sucking means is elevated.

According to the sixth aspect, the pushing means is used while the peeling tape is being contacted with the film of the wafer by the wafer sucking means capable of being elevated. Therefore, it is possible to prevent the peeling tape from sticking to an edge portion of the wafer sucking means.

The seventh aspect of the present invention provides a film sticking device according to the sixth aspect, further comprising a detection means for detecting a total thickness of the water and the film, which has been stuck onto the sticking face of the film, and the wafer sucking means can be automatically raised so that the film can be contacted with only the film on the film sticking face.

In the seventh aspect, the wafer sucking means is automatically elevated according to the total thickness of the wafer and the film. Therefore, even in the case where a wafer and film have different thicknesses, the difference in the thickness being caused by the degree of back-grinding, are used, it is possible to prevent the peeling tape from sticking to the edge portion of the wafer sucking means.

The eighth aspect provides a film peeling method for peeling a film which has been stuck onto a film sticking face of a wafer, comprising the steps of: arranging a wafer on the wafer sucking means so that the film sticking face of the wafer can be an upper face; feeding a peeling tape onto the film of the film sticking face; pushing one portion of the peeling tape against the film of the wafer by a pushing means so that the adhesive strength between the peeling tape and the film can be enhanced in one portion of the peeling tape; and peeling the film from the film sticking face of the wafer by the peeling tape while the one portion of the peeling tape, the adhesive strength of which has been enhanced, is being used as a peeling start point.

In the eighth aspect, in order to form a portion, the adhesive strength of which is higher, only one portion of the peeling tape at the edge portion of the wafer is pushed by the pushing means. Accordingly, the load applied to the wafer by the pushing means is relatively low. Therefore, the wafer can be prevented from being damaged. Further, it is sufficient that the pushing member may be a relatively small member. Therefore, it is possible to avoid a case in which the entire film peeling device is made large in size. Further, as only the necessary portion of the peeling tape is pushed by the pushing means, one portion of the wafer sucking means, which is located around the wafer, is not pushed. Therefore, even when the pushing means is polluted with the adhesive of the peeling tape, the wafer sucking means is not polluted with the adhesive. Accordingly, it is possible to avoid the occurrence of a problem that the wafer sucking means is clogged and that the wafer is damaged on the basis of incomplete sucking.

The ninth aspect of the present invention provides a film peeling method according to the eighth aspect, further comprising the step of elevating the wafer sucking means after the peeling tape was fed so that the peeling tape can be contacted with only the film of the film sticking face.

According to the ninth aspect, the pushing means is used while the peeling tape is being contacted with the film of the wafer by the wafer sucking means capable of being elevated. Therefore, it is possible to prevent the peeling tape from sticking to an edge portion of the wafer sucking means.

The tenth aspect of the present invention provides a film peeling method according to the ninth aspect, further comprising the steps of: detecting a total thickness of the water and the film, which has been stuck onto the film sticking face; and elevating the wafer sucking means according to the thus detected total thickness.

In the tenth aspect, the wafer sucking means is automatically elevated according to the total thickness of the wafer and the film. Therefore, even in the case where a wafer and film of different thicknesses, the difference in the thickness being caused by the degree of back-grinding, are used, it is possible to prevent the peeling tape from sticking to the edge portion of the wafer sucking means.

The aspects described above have the following advantage in common. The wafer is prevented from being damaged, and the size of the entire film peeling device is prevented from being made larger.

The second aspect can provide an advantage that only one portion of the peeling tape can be easily pushed.

Further, the third aspect can provide an advantage that only a desired portion of the peeling tape can be very easily pushed.

Further, the fourth aspect can provide an advantage that the adhesive strength between the peeling tape and the film can be enhanced in a very stably condition.

Further, the fifth aspect can provide an advantage that the film peeling device of this aspect can be applied to a wafer of different size.

Further, the sixth aspect can provide an advantage that the peeling tape can be prevented from sticking to an edge portion of the wafer sucking means.

Further, the seventh aspect can provide an advantage that the peeling tape can be prevented from sticking to an edge portion of a wafer sucking means even in the case where a wafer and film of different thicknesses, the difference in the thickness being caused by the degree of back-grinding, are used.

Further, the ninth aspect can provide an advantage that the peeling tape can be prevented from sticking to an edge portion of the wafer sucking means.

Further, the tenth aspect can provide an advantage that the peeling tape can be prevented from sticking to an edge portion of a wafer sucking means even in the case where a wafer and film of different thicknesses, the difference in the thickness being caused by the degree of back-grinding, are used.

These and other objects, features and advantages of the present invention will be apparent in light of the detailed description of exemplary embodiments thereof as illustrated by the drawings.

BRIEF DESCRIPTION OF THE DRAWINGS

In the drawings:

FIG. 8b is a partially enlarged view showing a state of operation of the tape peeling device shown in FIG. 8a.

DESCRIPTION OF THE PREFERRED EMBODIMENTS

By referring to the accompanying drawings, embodiments of the present invention will be explained below. In the following drawings, like parts are indicated by the same reference characters. In order to facilitate understanding, the scale is appropriately changed in these drawings.

Figure 1:
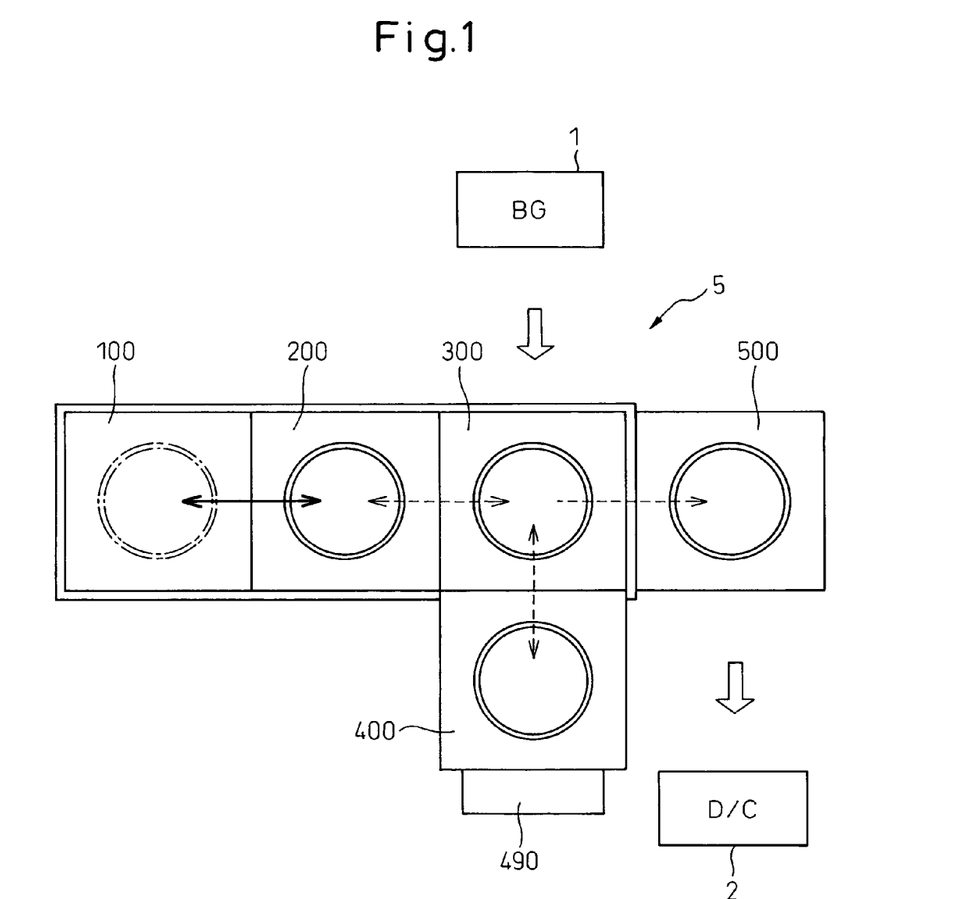
FIG. 1 is a schematic diagram of the wafer processing device according to the present invention.

FIG. 1 is a schematic diagram of the wafer processing device according to the present invention. As shown in FIG. 1, a wafer, the thickness of which is reduced by being ground by the back-grinder (BG) 1, is supplied to the wafer processing device 5. When a back surface of the wafer is ground, it is necessary to protect a semiconductor chip formed on a front surface of the wafer. Therefore, the surface-protective film 110 is stuck onto the front surface of the wafer 12 supplied to the wafer processing device 5.

As shown in FIG. 1, the wafer processing device 5 includes a reversal unit 300 for reversing the wafer 120. The wafer 120, on the front surface of which the surface-protective film 110 is stuck and the back surface of which is ground by the back-grinder 1, is supplied into the reversal unit 300 by a loader not shown in the drawing. At the time of grinding the back surface by the back-grinder 1, the back surface of the wafer 120 is directed upward. Therefore, when the wafer 120 is supplied to the reversal unit 300, the back surface of the wafer 120 is directed upward. Accordingly, in the reversal unit 300, the aforementioned wafer 120 is reversed with respect to the upper and lower sides, so that the front surface of the wafer 120, onto which the surface-protective film 110 is stuck, is directed upward. In this connection, as described later, it is also possible that the wafer 120 simply passes through the reversal unit 300 without being reversed.

In a certain type of surface-protective film 110, when the surface-protective film 110 is irradiated with a predetermined quantity of ultraviolet light, the adhesive strength of the surface-protective film 110 is decreased. When this type surface-protective film 110 is employed, the ultraviolet light irradiating unit of the wafer processing device 5 shown in FIG. 1 can be utilized, that is, UV irradiating unit 400 can be utilized. As the wafer 120 is supplied to UV irradiating unit 400 under the condition that the front surface, on which the surface-protective film 110 has been stuck, is directed upward, a predetermined quantity of ultraviolet rays is irradiated onto the surface-protective film 110 by UV lamp 490, and then the wafer 120 is returned to the reversal unit 300. When the wafer 120 is moved as described above, a moving device is used, for example, a robot arm is used. As a moving device such as a robot arm is commonly used, the illustration and explanation of the moving device are omitted here. In this connection, in the case where the surface-protective film 110, the adhesive strength of which is not changed by the irradiation with ultraviolet light, is used, it is unnecessary to supply the wafer 120 to UV irradiating unit 400. Therefore, the step of conducting UV irradiation can be omitted.

Next, the wafer 120 is supplied from the reversal unit 300 to the positioning unit 200. The positioning unit 200 is provided with a circular suction table 31 (not shown in FIG. 1) to suck the wafer 120. This suction table 31 is made of a porous ceramic and is connected to a vacuum source not shown in the drawing. The diameter of the suction table 31 is substantially the same as the diameter of the wafer 120 to be sucked. Alternatively, the diameter of the suction table 31 is larger than the diameter of the wafer 120 to be sucked. In the positioning unit 200, a positioning sensor (not shown) is provided at an upper level from the suction table 31. When this positioning sensor is used, the wafer 120 can be concentrically positioned on the suction table with high accuracy. Next, when the vacuum source is driven, the wafer 120 is accurately sucked onto the suction table 31 while the surface-protective film 110 is being directed upward.

Figure 2:
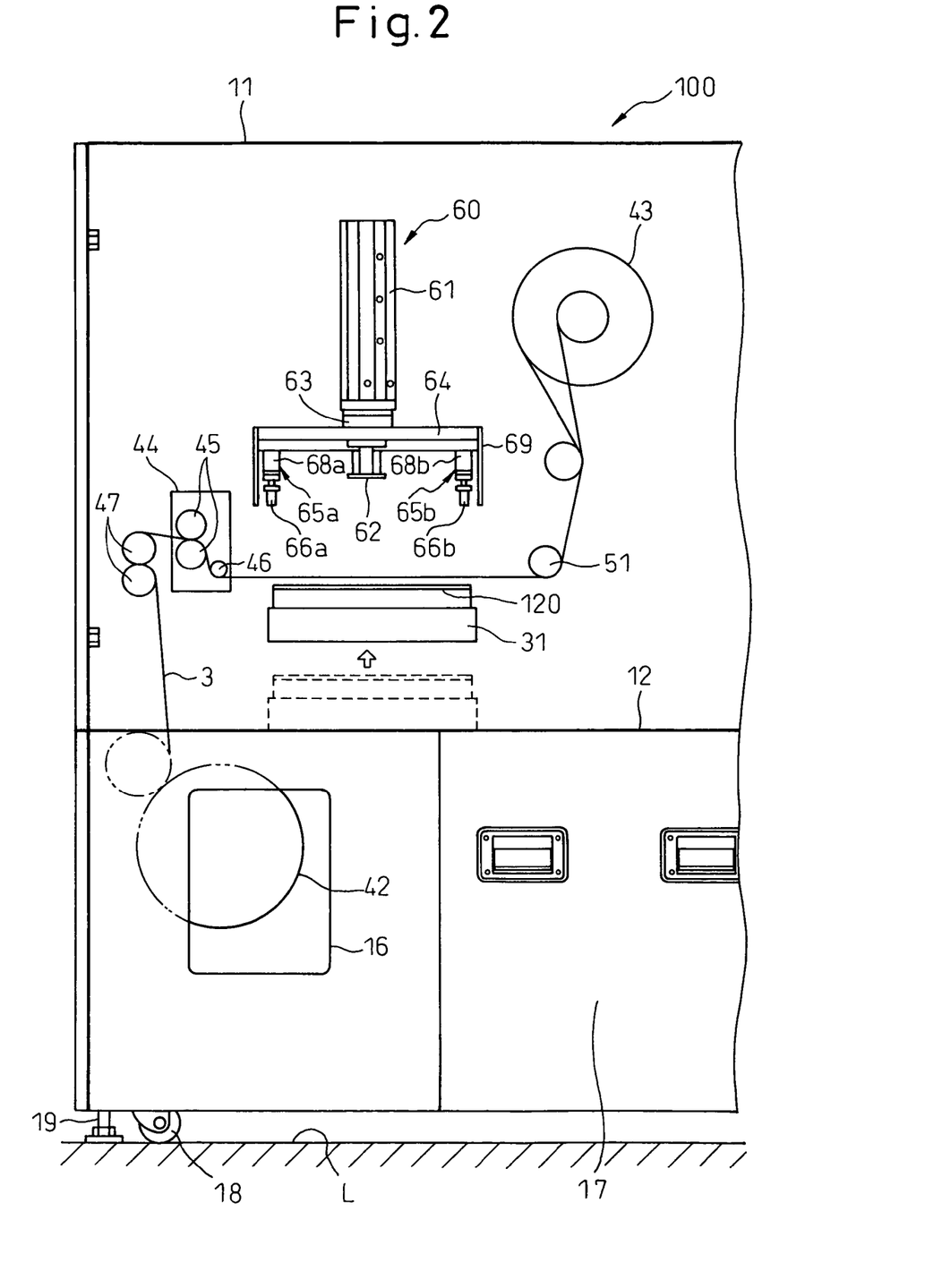
FIG. 2 is a side view showing a tape peeling device according to the present invention.

After that, while the suction table 31 is sucking the wafer 120, it is conveyed from the positioning unit 200 to the peeling unit 100. FIG. 2 is a side view showing a tape peeling device which is the peeling unit 100 according to the present invention. Referring to FIG. 2, the tape peeling device will be explained below.

The tape peeling device 100 shown in FIG. 2 includes: a supplying section 42 for supplying the peeling tape 3 into the housing 11; and a winding section 43 for winding up the peeling tape sent from the supplying section 42. The peeling tape 3 used in the tape peeling device 100 is used for peeling the surface-protective film 110 stuck on the front surface of the wafer 120. The width of this peeling tape 3 is smaller than the diameter of the wafer 120. The width of this peeling tape 3 is approximately half of the diameter of the wafer 120 in this embodiment.

As shown in the drawing, a plurality of casters 18 and stoppers 19 are provided on the bottom face of the housing 11. In FIG. 2, one caster 18 and stopper 19 are respectively shown. The tape peeling device 100 can be moved to a desired position on the floor L by the casters 18 and fixed at the position by the stoppers 19. The door 17 is provided in a lower portion of the tape peeling device 100. When this door 17 is opened, it is possible for an operator to have access to the control section 80, for example a digital computer, (not shown in the drawing) arranged in the lower portion of the tape peeling device 100.

As shown in FIG. 2, a pair of guide rollers 47 for guiding the peeling tape 3 and giving a predetermined tension to the peeling tape 3 are provided in the downstream of the supplying section 42. Further, the peeling section 44 is provided in the downstream of the guide rollers 47 and in the upstream of the suction table 31. As can be seen from FIG. 2, the peeling section 44 includes: a pair of rollers 45; and a peeling roller 46 located in the right downstream of the rollers 45. The width of the peeling roller 46 is longer than the maximum width of the suction table 31.

Although not shown in the drawing, for example, a portion of the peeling section 44 is connected to an endless chain which is engaged between two pulleys. These pulleys are connected to a motor not shown. When the motor is rotated in the normal and the reverse direction, the entire peeling section 44 can be reciprocated in the horizontal direction between the pulleys. Of course, the peeling section 44 may be reciprocated in the horizontal direction by the other drive mechanism. As described later in detail, when the peeling section 44 is moved in the horizontal direction on the diameter of the wafer 120 from one end of the wafer 120 to the other end of the wafer, the surface-protective film 110 can be peeled off from the front surface of the wafer 20. Downstream of the peeling section 44, the guide roller 51 for guiding the peeling tape 3 and the winding section 43 for winding the peeling tape 3 are provided. When the peeling tape 3 is fed by the supplying section 42, the peeling tape 3 is located to an upper level from the suction table 31.

As shown in FIG. 2, the shelf plate 12 is provided in the intermediate portion of the table peeling device 100. The suction table 31, onto which the wafer 120 has been sucked in the positioning unit 200, slides on the shelf plate 12 and enters into the region of the tape peeling device 100. Although an explanation is not given in detail, the suction table 31, which has entered to a predetermined position in the tape peeling device 100, can be elevated at this position. Therefore, according to the present invention, without arranging the wafer 120, which has been accurately positioned on the suction table 31 in the positioning unit 200, on the other table again, the surface-protective film 110 can be peeled off.

In this connection, in the embodiment shown in FIGS. 1 and 2, the suction table 31 can slide between the peeling unit 100 and the positioning unit 200. However, the suction table of the peeling unit 100 may be separately provided from the suction table of the positioning unit 200.

Referring to FIG. 2 again, in the housing 11, the pushing section 60 is provided at an upper level from the suction table 31. The pushing section 60 includes a casing 61. Into this casing 61, the rod 62 moving in the vertical direction is inserted. In FIG. 2, only a portion in the neighborhood of the forward end portion of the rod 62 is shown and almost all portion of the rod 62 shown in FIG. 2 is inserted into the casing 61. This rod 62 is connected to an actuator not shown in the drawing. The rod 62 can be elevated according to the motion of the actuator and rotated to a predetermined position.

As can be seen in FIG. 2, the disk 64 is connected to a portion in the neighborhood of the forward end portion of the rod 62 by the connecting section 63. The diameter of the disk 64 is substantially the same as the diameter of the wafer 120. Alternatively, the diameter of the disk 64 is larger than the diameter of the wafer 120. This disk 64 can be rotated together with the rod 62 or separately from the rod 62 according to a command given from the control section 80. Further, the cylindrical guide 69, the inner diameter of which is substantially the same as the diameter of the disk 64, is attached in such a manner that the cylindrical guide 69 extends downward from the edge portion of the disk 64. On the lower face of the disk 64, at least one pushing member 65 is provided, for example, three pushing members 65 are provided. As shown in the drawing, the pushing members 65*a*, 65*b* of the three pushing members, respectively include: extending sections 68*a*, 68*b*; and pushing rollers 66*a*, 66*b* attached to the forward end portions of the extending sections 68*a*, 68*b*. Concerning the residual pushing member 65*c* which is not shown in FIG. 2, the structure is similar as that described above.

Figure 3:
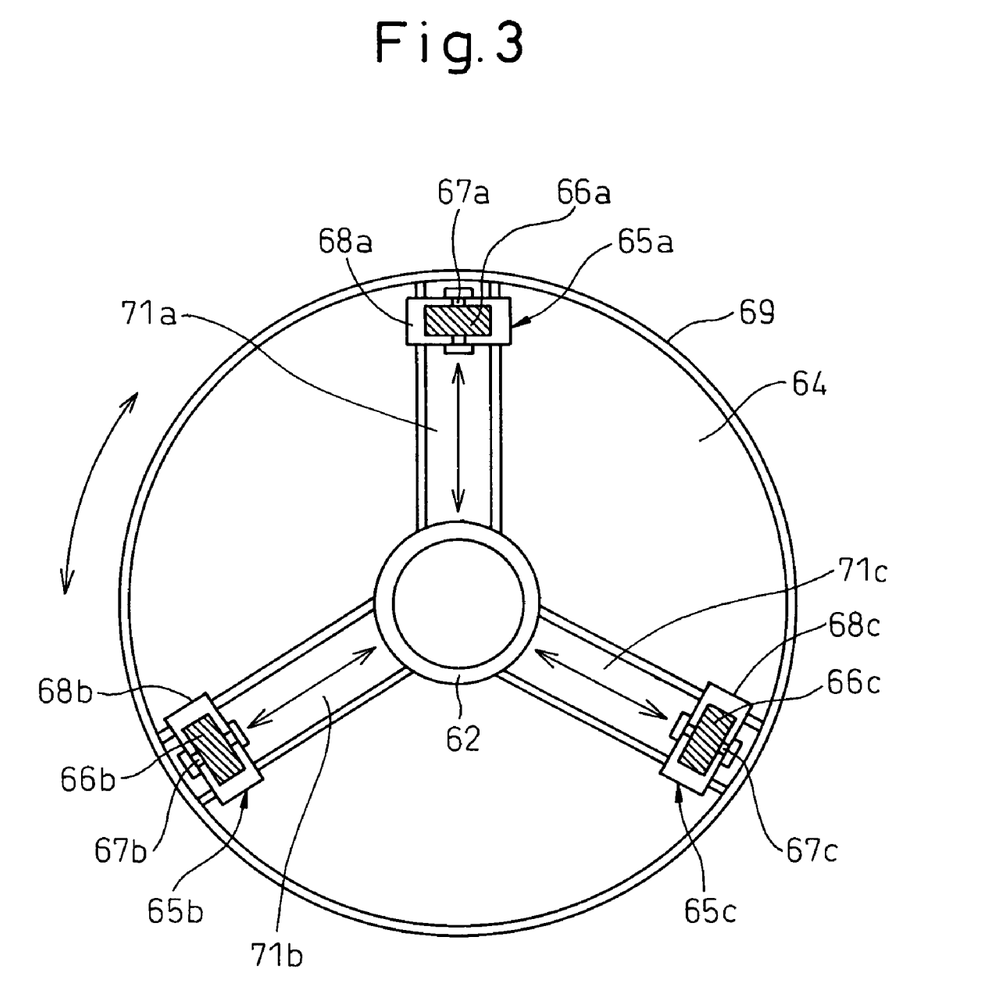
FIG. 3 is a bottom view of the rotatable disk.

FIG. 3 is a bottom view of the rotatable disk. The disk 64 shown in FIG. 3 includes three pushing members 65*a*, 65*b*, 65*c*. These pushing members 65*a*, 65*b*, 65*c* are respectively arranged near the forward end portions of three grooves 71*a*, 71*b*, 71*c* extending in the radial direction on the lower face of the disk 64. At proximal end portions of the extending sections 68*a*, 68*b*, 68*c* of these pushing members 65*a*, 65*b*, 65*c*, the engaging portions (not shown) respectively engaged with the grooves 71*a*, 71*b*, 71*c* are provided. When these engaging portions are engaged with the grooves 71*a*, 71*b*, 71*c*, the pushing members 65*a*, 65*b*, 65*c* can be respectively attached to the grooves 71*a*, 71*b*, 71*c*. The engaging portions of the extending sections 68*a*, 68*b*, 68*c* can slide along the grooves 71*a*, 71*b*, 71*c*. Due to the foregoing, each pushing member 65*a*, 65*b*, 65*c* can be positioned at a desired position in the groove 71*a*, 71*b*, 71*c*. Accordingly, even in the case where a surface-protective film 110 of the wafer 120' of a different size is peeled off, the peeling unit 100 of the present invention can be easily applied to the wafer 120' of a different size by adjusting the positions of the pushing members 65*a*, 65*b*, 65*c*.

As can be seen in FIG. 3, the grooves 71*a*, 71*b*, 71*c* are arranged so that an angle of about 120° can be formed between the grooves 71a, 71b, 71c. Therefore, in FIG. 3, the three pushing members 65a, 65b, 65c are arranged at substantially regular intervals on the lower face of the disk 64. In this connection, at least one of the distances between the adjacent two pushing members in the three pushing members 65a, 65b, 65c is larger than the width of the peeling tape 3.

The pushing roller 66 of the respective pushing member 65 is attached in such a manner that the rotary shaft 67 of the pushing roller 66 is directed in the radial direction of the disk 64. Further, as can be seen from FIG. 2, the forward end portion of the pushing roller 66 is substantially equal level to the forward end portion of the cylindrical guide 69. Alternatively, the forward end portion of the pushing roller 66 is located at a position a little lower than the forward end portion of the cylindrical guide 69.

Referring to FIG. 2 again, the suction table 31, which has been conveyed on the shelf plate 12 from the positioning unit 200 to the peeling unit 100, stops at a lower position of the pushing section 60, which is illustrated by dotted lines in FIG. 2. Next, the total thickness t of the wafer 120 and the surface-protective film 110 is measured by a thickness sensor not shown in the drawing. Concerning the wafer 120, the back surface of the wafer 120 have been ground, and the degree of grinding is different according to the lot number of the wafer, etc. Therefore, the thickness of the wafer 120 differs according to the lot number of the wafer etc. Information of the total thickness t, which has been measured by the thickness sensor, is supplied to the control section 80.

After that, by a well-known means not shown, the suction table 31 is elevated toward the peeling tape 3 located at a lower position of the pushing section 60. Concerning this operation, refer to FIG. 2. As the distance between the peeling tape 3, which is located at the lower position of the pushing section 60, and the shelf plate 12 is previously known, by using the above total thickness t, the surface-protective film 110 of the wafer 120 and the peeling tape 3 can be made to come softly into contact with each other. Since the surface-protective film 110 and the peeling tape 3 are made to come softly into contact with each other as described above, the peeling tape 3 is contacted with only the surface-protective film 110. That is, the peeling tape 3 is not contacted with the suction table 31. Especially, the peeling tape 3 is not contacted with an upper face edge portion of the suction table 31 having a sucking function. Accordingly, in the present invention, there is no possibility that the adhesive of the peeling tape 3 enters the holes formed on the upper face of the suction table 31 and the holes are clogged by the adhesive. Therefore, it is possible to avoid the occurrence of such a problems that the wafer 120 is incompletely sucked. Especially in the present invention, while consideration is being given to the total thickness t of the surface-protective film 110 and the wafer 120, the suction table 31 is elevated. Therefore, it is possible to positively avoid the occurrence of incomplete suction of the wafer 120.

Before the pushed area 60 is driven, the peeling tape 3 and the surface-protective film 110 are simply in soft contact with each other. Therefore, a sufficiently high adhesive strength is not generated between the peeling tape 3 and the surface-protective film 110. Accordingly, before the pushing section 60 is driven, the adhesive strength between the peeling tape 3 and the surface-protective film 110 is lower than the adhesive strength between the surface-protective film 110 and the wafer 120. Further, the adhesive strength between the peeling tape 3 and the surface-protective film 110 is lower than the suction force between the wafer 120 and the suction table 31. That is, when the peeling tape 3 is wound up in the above condition, only the peeling tape 3 is wound up and the surface-protective film 110 may be left being stuck onto the wafer 120.

Figure 4:
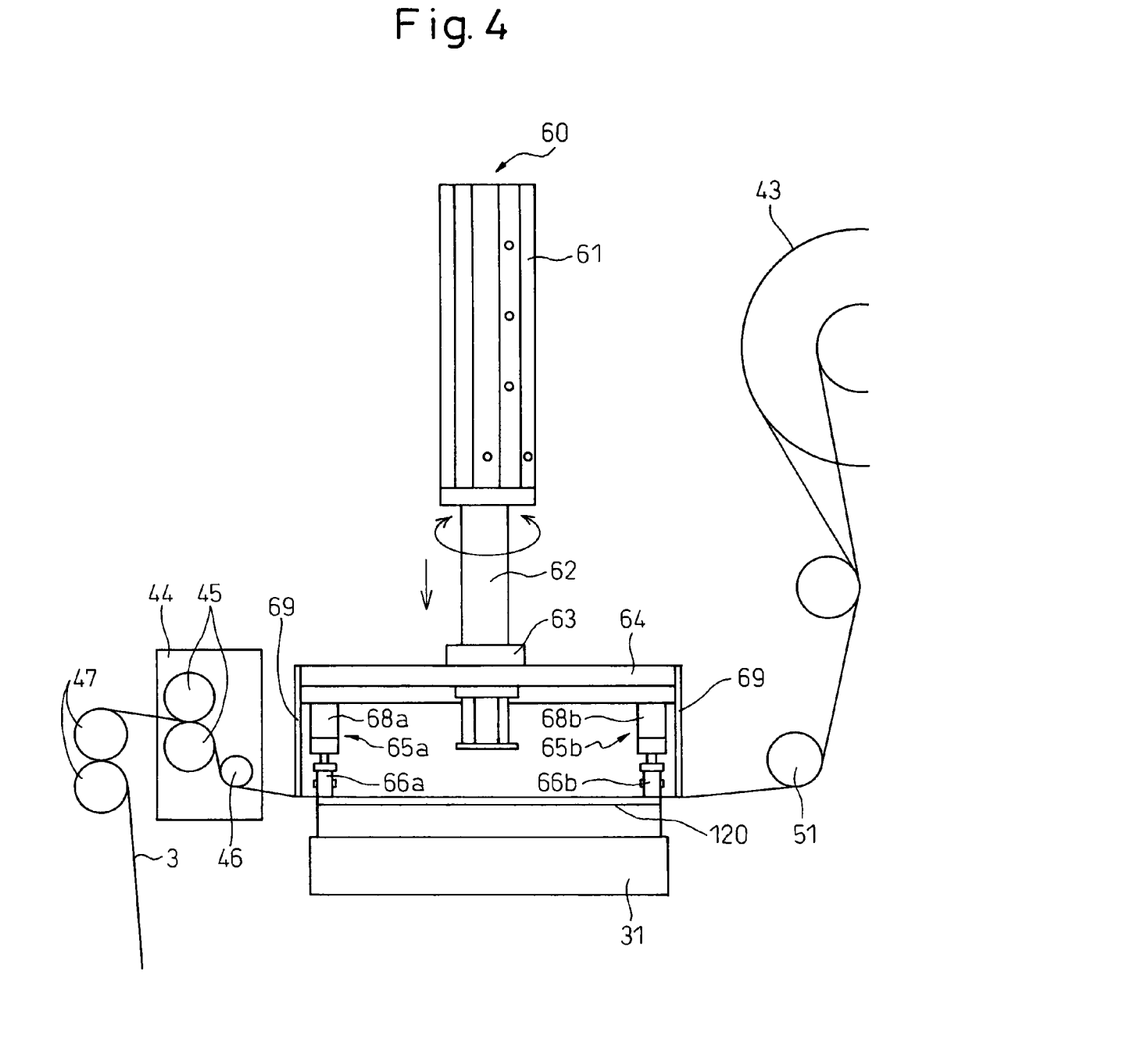
FIG. 4 is a partially enlarged view of the tape peeling device of the present invention in the state in which the pushing section is lowered.

FIG. 4 is a partially enlarged view of the tape peeling device of the present invention in the state in which the pushing section is lowered. Under the condition that the peeling tape 3 and the surface-protective film 110 come softly into contact with each other as described above, the pushing section 60 is operated. When the actuator not shown is driven, the rod 62 of the pushing section 60 extends downward. The rod 62 extends by a predetermined length. Due to the foregoing, the pushing roller 66 of the pushing member 65 pushes the surface-protective film 110 via the peeling tape 3. At this time, the forward end portion of the cylindrical guide 69 comes into contact with the peeling tape 3 as shown in FIG. 4. Therefore, an intensity of tension applied to the peeling tape 3 at the time of pushing can be reduced to a relatively low value.

Figure 5A:
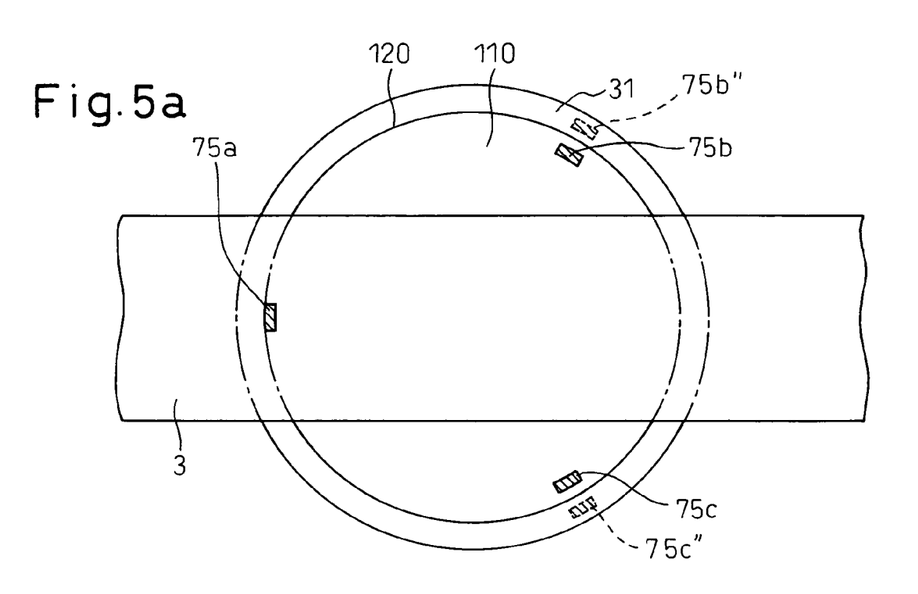
FIG. 5a is a plan view of the wafer showing a pushing area formed by the pushing member when the pushing section is driven.

FIG. 5a is a plan view of the wafer showing a pushed area formed by the pushing member when the pushing section is driven. In FIG. 5a, in the neighborhood of the edge portion of the wafer 120, the pushed areas 75a, 75b, 75c, which are formed by the pushing member 65, are shown. One pushed area in these three pushed areas 75a, 75b, 75c is formed in the region of the peeling tape 3, that is, the pushed area 75a in FIG. 3 is formed in the region of the peeling tape 3. When the pushed area 75a is formed, it is preferable that the rotary shaft 67a of the corresponding pushing roller 66a is located at a position on the centerline of the peeling tape 3. The residual pushed areas 75a, 75c are formed on the surface-protective film 110 of the wafer 120 on which the peeling tape 3 does not exist.

As the pushed area 75a is formed by the pushing action of the pushing roller 66a, the adhesive strength between the peeling tape 3 and the surface-protective film 110 is increased in the pushed area 75a. Therefore, after the pushing section 60 has been driven, the adhesive strength between the peeling tape 3 and the surface-protective film 110 at the pushed area 75a is higher than the adhesive strength between the surface-protective film 110 and the wafer 120. However, the adhesive strength between the peeling tape 3 and the surface-protective film 110 is not higher than the suction force between the wafer 120 and the suction table 31. Under the condition that the adhesive strength between the peeling tape 3 and the surface-protective film 110 at the pushed area 75a is increased, the peeling section 44 is driven.

Figure 6:
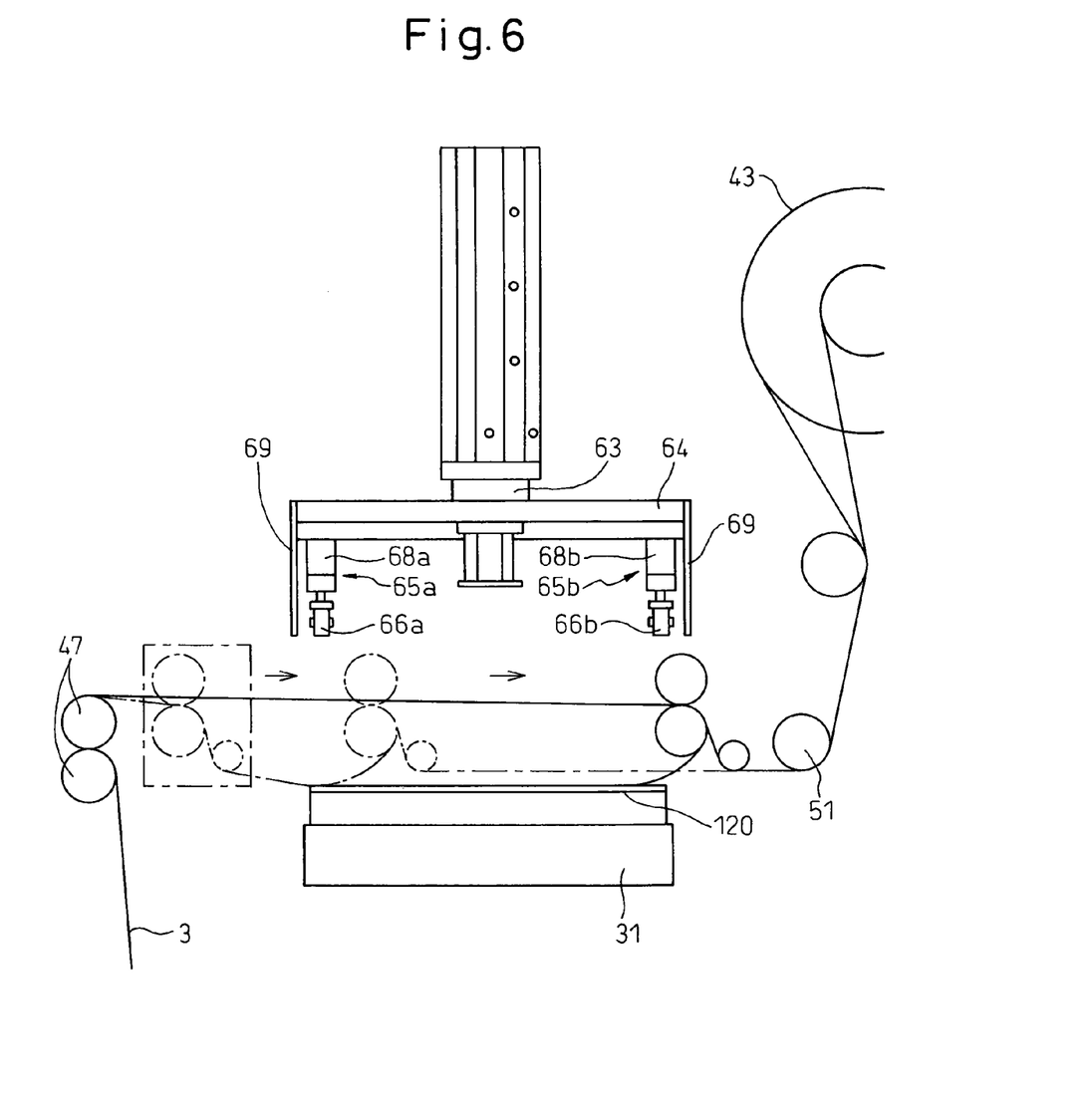
FIG. 6 is a partially enlarged view of the tape peeling device of the present invention in the state in which the pushing section is raised.

FIG. 6 is a partially enlarged view of the tape peeling device of the present invention showing a state in which the pushing section is raised. Before the peeling section 44 is driven, first of all, as shown in FIG. 6, the rod 62 of the pushing section 60 is retracted into the casing 61. Due to the foregoing, the pushing member 65 of the disk 64 is distant from the peeling tape 3. Therefore, except for the pushed area 75a, the peeling tape 3 comes softly into contact with the surface-protective film 110 of the wafer 120 again. Next, the peeling section 44 is slid from the left to the right in FIG. 6. At the same time, the winding section 43 is driven so as to wind up the peeling tape 3. As described before, at the pushed area 75a, the adhesive strength between the peeling tape 3 and the surface-protective film 110 is increased. Further, this adhesive strength is higher than the adhesive strength between the surface-protective film 110 and the wafer 120. Therefore, when the peeling tape 3 is wound up, the pushed area 75a functions as a peeling start position, and the surface-protective film 110 starts being peeled off from the wafer 120. When the peeling tape 3 is wound up, the surface-protective film 110 is wound up by the winding section 43 together with the peeling tape 3.

In the present invention, in order to form the pushed area 75a which functions as a peeling start portion, the special pushing member 65 is used. Further, the pushed area 75a formed by this pushing member 65 is relatively small, that is, the pushed area 75a formed by this pushing member 65 is smaller than the width of the peeling tape 3. Therefore, a load applied by the pushing member 65 is relatively low. Accordingly, it is possible to prevent the wafer 120 from being damaged by the load applied by the pushing member 65. Further, as the pushed area 60 including the pushing member 65 is relatively small, it is possible to prevent the entire peeling unit 100 from being made larger. As the pushing member 65a is small but sufficient to push one portion of the peeling tape 3, the suction table 31 cannot be polluted with the adhesive even if the pushing member 65a is polluted with the adhesive of the peeling tape 3. Accordingly, it is possible to avoid the occurrence of the problems that the suction table 31 is clogged by the adhesive and the suction of the wafer becomes incomplete and the wafer is damaged.

Referring to FIG. 5a again, since no peeling tape 3 exists at the positions of the pushed areas 75b, 75c shown in FIG. 5a, the pushing rollers 66b, 66c corresponding to the pushed areas 75b, 75c do not affect the adhesive strength between the peeling tape 3 and the surface-protective film 110. Therefore, it is possible to employ such a structure that the peeling unit 100 of the present invention has only a single pushing member 65a to push the peeling tape 3. However, according to this structure, at the time of pushing, the single pushing member 65a is supported as a cantilever. Accordingly, a load concentrates upon the engaging portion of the pushing member 65a. Accordingly, there is a possibility that the pushing member 65a is damaged. In order to solve the above problem, it is preferable that the pushing members 65b, 65c, which function as an auxiliary roller not pushing the peeling tape 3, are provided so as to disperse the load at the time of pushing. Due to the foregoing, it is possible to avoid the occurrence of such a problem that the single pushing member 65a is damaged. Further, it is possible to stably enhance the adhesive strength between the peeling tape and the surface protecting film. In the case where the pushing members 65b, 65c push the surface protective tape 110 of the wafer 120 in the pushed areas 75b, 75c, there is a possibility that the surface protective tape 110 is partially affected by the pushing action. In order to prevent the occurrence of this problem, it is possible to adjust the positions of the pushing members 65b, 65c so that the pushing members 65b, 65c can push the suction table 31 in the pushed areas 75b", 75c".

The adhesive strength of the surface-protective film 110 has already been lowered by the chemical change caused at the point of time when the surface-protective film 110 is irradiated with UV rays by UV irradiation unit 400. Therefore, even when the surface-protective film 110 is pushed by the pushing rollers 66b, 66c, the adhesive strength between the surface-protective film 110 and the wafer 120 is not increased again. Even in the case where the wafer 120 is not supplied to UV irradiation unit 400, as the surface-protective film 110 is stuck to the wafer 120 with a sufficiently high pushing force by a roller not shown before the step of back-grinding, even when the surface-protective film 110 is pushed again by the pushing rollers 66b, 66c, the adhesive strength between the surface-protective film 110 and the wafer 120 is not increased.

Figure 5B:
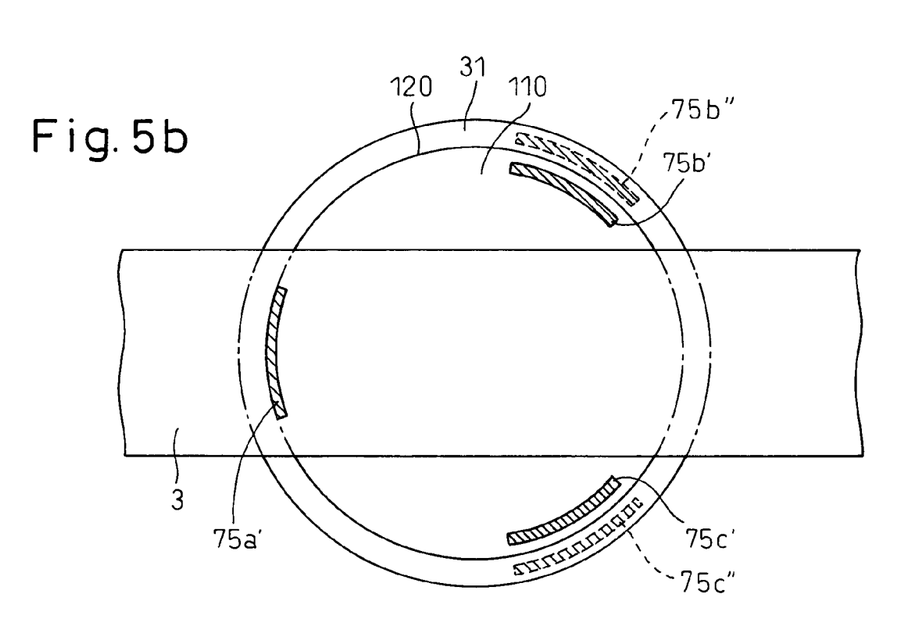
FIG. 5b is a top face view of the wafer and the peeling tape showing a locus of the pushed area formed by the pushing member when the disk is rotated.

Further, it is possible to rotate the rod 62 together with the disk 64 a predetermined distance after the pushing member 65a is pushed against the surface-protective film 110 via the peeling tape 3. FIG. 5b is a top face view of the wafer and the peeling tape showing a locus of the pushed area formed by the pushing member when the disk is rotated. As described above, as the rotary shafts 67a, 67b, 67c of the pushing rollers 66a, 66b, 66c are located on the radiuses of the disk 64, when the rod 62 is rotated together with the disk 64, the pushed areas 75a', 75b', 75c' formed by the pushing rollers 66a, 66b, 66c respectively draw an arcuate locus. As the diameter of the disk 64 is sufficiently larger than the width of the peeling tape 3, in the case where the rotary shaft 67a of the pushing roller 66a is located on the centerline of the peeling tape 3, the arc-like pushed area 75a' formed on the peeling tape 3 is directed in the substantially traverse direction of the peeling tape 3. As the peeling section 44 described above moves in the longitudinal direction of the peeling tape 3, in the case where the pushed area 75a' is formed in the substantially traverse direction of the peeling tape 3, all of one long side of the pushed area 75a' simultaneously starts peeling the surface-protective film 110. Therefore, the surface-protective film 110 can be uniformly peeled off from the wafer 120.

In this connection, it is preferable that a distance corresponding to the chord of the arc of the pushed area 75a is smaller than the width of the peeling tape 3 and the entire pushed area 75a' is located in the region of the peeling tape 3. Due to the foregoing, it is possible to reduce a loss of energy when the disk 64 is rotated and the pushed area 75a' is formed in the region of the peeling tape 3.

It is preferable that the disk 64 shown in FIG. 4 is rotated in one direction and then in the opposite direction several times so that the pushing roller 66a can be reciprocated on the locus of the pushed area 75a'. In this case, the adhesive strength between the peeling tape 3 and the surface-protective film 110 in the pushed area 75a' can be greatly increased as compared with a case in which the pushing roller 66a is not reciprocated. Therefore, the peeling operation of the surface-protective film 110 by the peeling tape can be positively performed.

Referring to FIG. 1 again, after the surface-protective film 110 has been peeled off in the peeling unit 100, while the suction table 31 is sucking the wafer 120, the suction table 31 is returned to the positioning unit 200. Then, the wafer 120 is returned to the reversal unit 300 by a loader not shown. As the wafer 120 is directed upward at this time, the wafer 120 passes through the reversal unit 300 without being reversed and is supplied to the recovery section 500. In the recovery section 500, the wafer 120 is successively recovered by a predetermined cassette. Next, the wafer 120 is supplied to a device used in the subsequent process, for example, the wafer 120 is supplied to the dicing device 2.

Figure 7:
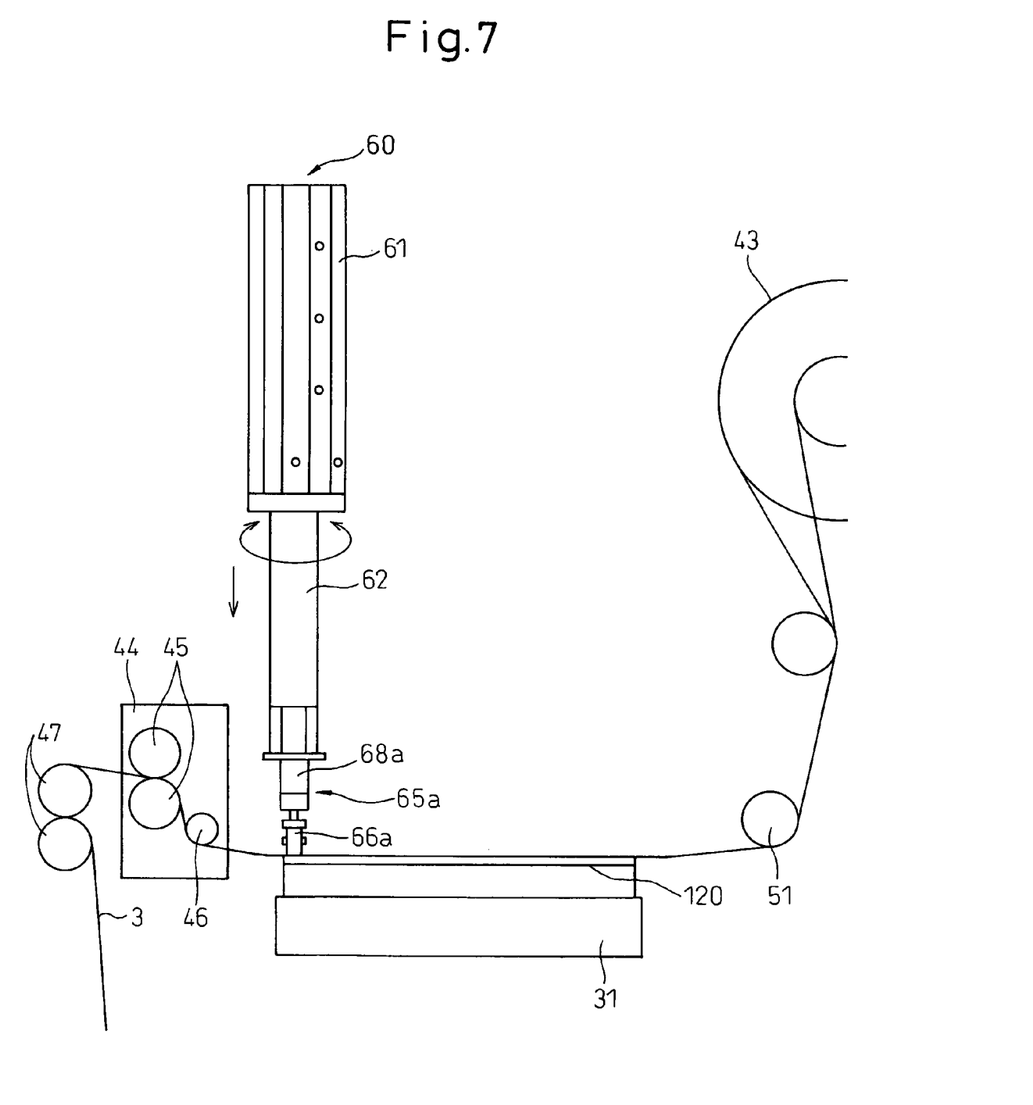
FIG. 7 is a side view showing another tape peeling device of the present invention provided with a single pushing member.

In the case where only the single pushing member 65a is provided as described above, the peeling unit 100 of the present invention is not necessarily provided with the disk 64. For example, the following constitution may be employed. The pushing member 65a is attached to the forward end portion of the rod 62, and the pushing roller 66a of the pushing member 65a pushes against the surface-protective film 110 via the peeling tape 3. Concerning this constitution, refer to FIG. 7.

Figure 8A:
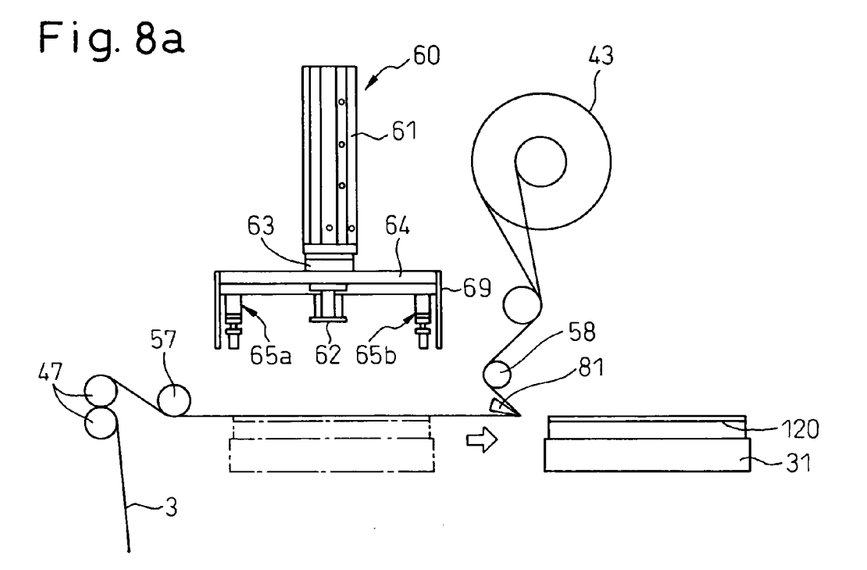
FIG. 8a is a side view showing another tape peeling device according to the present invention.

In the embodiment explained referring to the drawings, the peeling section 44 includes a roller 46 moving in parallel with the wafer 120. However, another type peeling section may be adopted. FIG. 8a is a side view showing another tape peeling device according to the present invention. The peeling section 44' shown in FIG. 8a includes a peeling bar 81 extending perpendicularly to the direction of the peeling tape 3. This peeling bar 81 is arranged on the downstream side of the pushing section 60. The peeling bar 81 is a rod-shaped body, the cross-section of which is substantially triangular. The length of the peeling bar 81 is larger than the diameter of the wafer 120. As shown in the drawing, the peeling bar 81 is arranged in such a manner that the peeling tape 3 can be bent at the forward end side of the peeling bar 81 which corresponds to the vertex of the triangular cross-section. The forward end side of the peeling bar 81 is located at a position a little higher than the surface-protective film 110 of the wafer 120 being supported, by the other guide roller not shown in the drawing. In the upstream of the pushing section 60, the guide roller 57 is arranged. In the downstream of the peeling bar 81, the guide roller 58 is arranged.

In this embodiment, under the condition that the suction table 31 is elevated to the peeling tape 3 and the peeling tape 3 is made to come softly into contact with the surface protective tape 110 as described above, the pushing section 60 is driven. When the disk 64 is lowered by extending the rod 62, the pushing member 65 pushes the surface-protective film 110 via the peeling tape 3. In this case, in order to avoid the occurrence of a problem in which the pushing members 65a, 65c push the peeling tape 3 on the downstream side, the disk 64 is previously rotated by about 60°. Due to the foregoing, the pushing member 65b located on the downstream side the functions to actually push the surface-protective film 110 via the peeling tape 3, and the residual pushing members 65a, 65c function as auxiliary rollers. At this time, as explained referring to FIG. 5b, the disk 64 may be appropriately rotated.

Figure 8B:
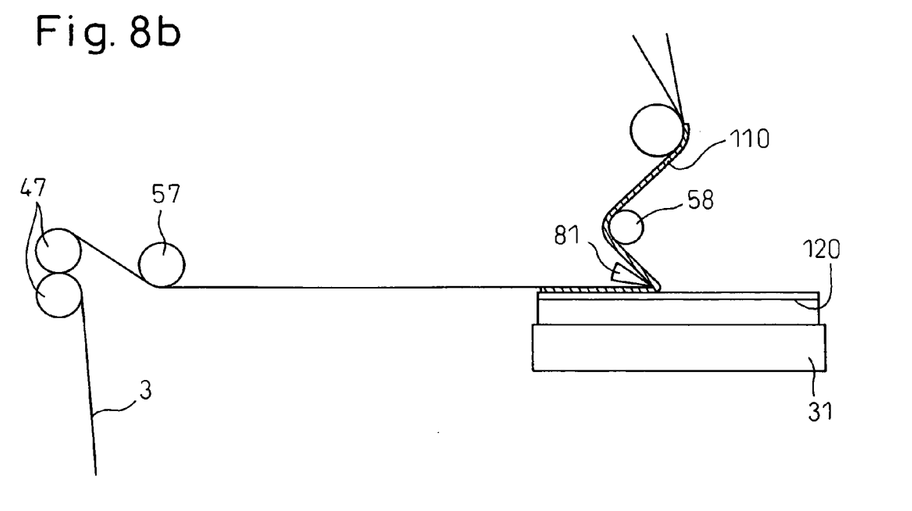

Next, the rod 62 of the pushing section 60 is retracted, and the pushing member 65 is away from the peeling tape 3. After the pushed area 75b was formed, the suction table 31 is moved in the horizontal direction as shown in the drawing so that the suction table 31 can pass under the peeling bar 81. Since the peeling bar 81 is located at a position a little higher than the surface-protective film 110 of the wafer 120 as described above, the surface-protective film 110 is not contacted with the peeling bar 81, and the suction table 31 passes under the peeling bar 81. Due to the foregoing, the surface-protective film 110 is peeled off from the wafer 120 in the same manner while the pushed area 75b described above is being used as the peeling start position. In this embodiment, as the pushed area 75b is previously formed by the pushing section 60, it is unnecessary to form a area, the adhesive strength of which is increased between the peeling tape 3 and the surface-protective film 110, by the peeling bar 81. Accordingly, it is unnecessary to push the wafer 120 by the peeling bar 81. Due to the foregoing, the surface-protective film 110 can be peeled off from the wafer 120 while the damage of the wafer is being prevented. In this case, as shown in FIG. 8b which is a partially enlarged view showing a state of operation of the tape peeling device, the surface protective tape 110 is peeled off from the wafer 120 together with the peeling tape 3 by the peeling bar 81 and then wound up, at the right upper portion of FIG. 8b, by the winding section 43.

Although the invention has been shown and described with exemplary embodiments thereof, it should be understood by those skilled in the art that the foregoing and various other changes, omissions and additions may be made therein and thereto without departing from the spirit and the scope of the invention.

The invention claimed is:

1. A film peeling device for peeling a film which has been stuck onto a film sticking face of a wafer, comprising:
    a wafer sucking means for sucking the wafer so that the film sticking face of the wafer can become an upper face;
    a peeling tape feeding means for feeding a peeling tape onto the film of the film sticking face;
    a pushing means for pushing only one portion of the peeling tape against the film of the wafer at an edge portion of the wafer so that an adhesive strength between the peeling tape and the film can be enhanced in the one portion of the peeling tape; and
    a peeling means for peeling the film from the film sticking face of the wafer by the peeling tape while the one portion of the peeling tape, the adhesive strength of which has been enhanced, is used as a peeling start portion,
    wherein the pushing means includes a pushing roller moving in a substantially transverse direction of the peeling tape, wherein the one portion of the peeling tape is pushed when the pushing roller moves on the one portion of the peeling tape,
    wherein the pushing means includes a rotatable disk, wherein the pushing roller is attached to a lower face of the rotatable disk in such a manner that the rotary axis of the pushing roller can be located on the radius of the rotatable disk, and the pushing roller is moved along an arc on the peeling tape when the rotatable disk is rotated, and
    wherein an auxiliary roller is attached to the lower face of the rotatable disk, and the auxiliary roller pushes the film of the wafer located at a position where the peeling tape does not exist.

2. A film peeling device according to claim 1, wherein positions at which the pushing roller and the auxiliary roller are located can be adjusted in the radial direction on the lower face of the rotatable disk.

3. A film sticking device according to claim 1 or 2, wherein the wafer sucking means can be elevated, and a peeling tape, which has been fed by the peeling tape feeding means, can be contacted with only the film of the film sticking face when the wafer sucking means is elevated.

4. A film sticking device according to claim 3, further comprising a detection means for detecting a total thickness of the wafer and the film, which has been stuck onto the sticking face of the film, and the wafer sucking means can be automatically raised so that the film can be contacted with only the film of the film sticking face.

* * * * *